(12) United States Patent
Urushido

(10) Patent No.: US 7,042,069 B2
(45) Date of Patent: May 9, 2006

(54) SEMICONDUCTOR DEVICE AND METHOD OF MANUFACTURING SAME, WIRING BOARD, ELECTRONIC MODULE, AND ELECTRONIC INSTRUMENT

(75) Inventor: Tatsuhiro Urushido, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/996,472

(22) Filed: Nov. 26, 2004

(65) Prior Publication Data

US 2005/0140014 A1 Jun. 30, 2005

(30) Foreign Application Priority Data

Nov. 28, 2003 (JP) ............................. 2003-399136

(51) Int. Cl.
*H01L 23/495* (2006.01)
(52) U.S. Cl. .................. 257/666; 257/668; 257/672; 257/676; 257/669
(58) Field of Classification Search ............... 257/666, 257/677, 691, 786, 667–676, E23.031, E23.059; 438/111–112, 123, FOR. 367, FOR. 377, 438/FOR. 380, 643–685
See application file for complete search history.

(56) References Cited

U.S. PATENT DOCUMENTS

| | | | | |
|---|---|---|---|---|
| 5,569,964 | A * | 10/1996 | Ikebe | 257/780 |
| 6,433,441 | B1 * | 8/2002 | Niwa et al. | 257/784 |
| 6,563,201 | B1 * | 5/2003 | Golz | 257/672 |
| 6,674,156 | B1 * | 1/2004 | Bayan et al. | 257/670 |
| 2002/0171130 | A1 * | 11/2002 | Takahashi et al. | 257/673 |
| 2002/0172026 | A1 * | 11/2002 | Chong et al. | 361/777 |
| 2003/0178708 | A1 * | 9/2003 | Minamio et al. | 257/666 |

FOREIGN PATENT DOCUMENTS

| | | | | |
|---|---|---|---|---|
| JP | 5-47819 | * | 2/1993 | 257/786 |
| JP | 6-84992 | * | 3/1994 | 257/692 |
| JP | A-07-235564 | | 9/1995 | |
| JP | A-07-273119 | | 10/1995 | |
| JP | 2004-193223 A | | 7/2004 | |

OTHER PUBLICATIONS

U.S. Appl. No. 10/996,471, filed Nov. 26, 2004, Tatsuhiro Urushido.
U.S. Appl. No. 10/994,403, filed Nov. 23, 2004, Tatsuhiro Urushido.

* cited by examiner

*Primary Examiner*—Jasmine Clark
(74) *Attorney, Agent, or Firm*—Oliff & Berridge, PLC

(57) ABSTRACT

A plurality of leads includes a plurality of lead groups, each of which are formed of at least two first leads, and a plurality of second leads. Each of the second leads is positioned between an adjacent pair of the lead groups. Each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing. Each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

11 Claims, 5 Drawing Sheets

SEMICONDUCTOR DEVICE AND METHOD OF MANUFACTURING SAME, WIRING BOARD, ELECTRONIC MODULE, AND ELECTRONIC INSTRUMENT

Japanese Patent Application No. 2003-399136, filed on Nov. 28, 2003, is hereby incorporated by reference in its entirety.

BACKGROUND OF THE INVENTION

The present invention relates to a semiconductor device and a method of manufacturing the same, a wiring board, an electronic module, together with an electronic instrument.

In chip-on-film (COF) packaging, leads are connected electrically to electrodes of a semiconductor chip. The pitch of such electrodes has recently become closer, and thus the pitch of the leads must also become closer. From considerations concerning the ease with which a lead can deform in the vicinity of the bond with the corresponding electrode, however, there is a limit to the closeness of this pitch and thus it is difficult to ensure that adjacent leads do not touch.

BRIEF SUMMARY OF THE INVENTION

A semiconductor device according to a first aspect of the present invention includes:

a substrate on which is formed a plurality of leads; and a semiconductor chip having a plurality of electrodes, the leads and the electrodes being mounted on the substrate in a manner to face each other and to be electrically connected, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

An electronic module according to a second aspect of the present invention has the above semiconductor device mounted thereon.

An electronic instrument according to a third aspect of the present invention has the above semiconductor device.

A wiring board according to a fourth aspect of the present invention includes:

a substrate; and a plurality of leads which are formed on the substrate, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

A method of manufacturing a semiconductor device according to a fifth aspect of the present invention includes:

mounting a semiconductor chip having a plurality of electrodes onto a substrate on which is formed a plurality of leads, in such a manner that the electrodes face the leads; and bonding the electrodes and the leads, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

DETAILED DESCRIPTION OF THE EMBODIMENTS

Figure 1:
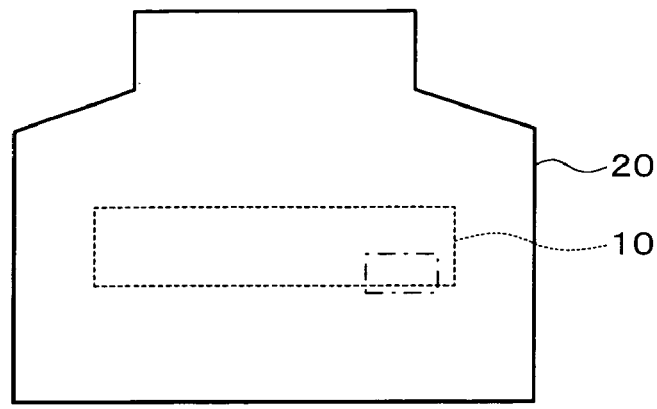
FIG. 1 is illustrative of a semiconductor device in accordance with a first embodiment of the present invention.

Embodiments of the present invention may prevent contact between leads.

(1) A semiconductor device according to an embodiment of the present invention includes:

a substrate on which is formed a plurality of leads; and a semiconductor chip having a plurality of electrodes, the leads and the electrodes being mounted on the substrate in a manner to face each other and to be electrically connected, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

With this embodiment, the second portions of the outermost pair of first leads of each of the lead groups are disposed at a comparatively small spacing. It is therefore possible to ensure a region of a comparatively wide spacing between the second portions of adjacent lead groups. Since the second lead is disposed in this region, it is possible to avoid contact between the first and second leads.

(2) With this semiconductor device, an adjacent pair of the second leads may be disposed so as to sandwich one of the lead groups, and the outermost pair of the first leads of each of the lead groups may be formed so that the first spacing is greater than or equal to a spacing of the adjacent pair of the second leads.

(3) With this semiconductor device, the plurality of lead groups may include a first lead group and a second lead group, the second leads may be formed in such a manner that an end of each of the second leads does not pass over a straight line, and the first portion of each of the outermost pair of the first leads of the first lead group may be disposed at a position closer to the straight line than the first portion of each of the outermost pair of the first leads of the second group.

(4) With this semiconductor device, each of the lead group may include at least three of the first leads, and the outermost pair of the first leads of each lead group may be of a different length from a length of a remaining one of the first leads which is sandwiched between the outermost pair of the first leads.

(5) An electronic module according to an embodiment of the present invention has the above semiconductor device mounted thereon.

(6) An electronic instrument according to an embodiment of the present invention has the above semiconductor device.

(7) A wiring board according to another embodiment of the present invention includes:

a substrate; and a plurality of leads which are formed on the substrate, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

With this embodiment, the second portions of the outermost pair of first leads of each of the lead groups are disposed at a comparatively small spacing. It is therefore possible to ensure a region of a comparatively wide spacing between the second portions of adjacent lead groups. Since the second lead is disposed in this region, it is possible to avoid contact between the first and second leads.

(8) With this wiring board, an adjacent pair of the second leads may be disposed so as to sandwich one of the lead groups, and the outermost pair of the first leads of each of the lead groups may be formed so that the first spacing is greater than or equal to a spacing of the adjacent pair of the second leads.

(9) With this wiring board, the plurality of lead groups may include a first lead group and a second lead group, the second leads may be formed in such a manner that an end of each of the second leads does not pass over a straight line, and the first portion of each of the outermost pair of the first leads of the first lead group may be disposed at a position closer to the straight line than the first portion of each of the outermost pair of the first leads of the second group.

(10) With this wiring board, each of the lead group may include at least three of the first leads, and the outermost pair of the first leads of each lead group may be of a different length than a length of a remaining one of the first leads which is sandwiched between the outermost pair of the first leads.

(11) A method of a manufacturing a semiconductor device according to a further embodiment of the present invention includes:

mounting a semiconductor chip having a plurality of electrodes onto a substrate on which is formed a plurality of leads, in such a manner that the electrodes face the leads; and bonding the electrodes and the leads, wherein the plurality of leads includes a plurality of lead groups, each of which are formed of at least two first leads, and a plurality of second leads, wherein each of the second leads is positioned between an adjacent pair of the lead groups, wherein each of an outermost pair of the first leads of each of the lead groups includes a first portion and a second portion, the first portion of each of the outermost pair of the first leads being positioned at a first spacing apart and the second portion of each of the outermost pair of the first leads being positioned at a second spacing apart which is smaller than the first spacing, and wherein each of the second leads is disposed in a manner to avoid a region that is sandwiched between the first portion of each of the adjacent pair of the lead groups and has a portion that is disposed in a region that is sandwiched between the second portion of each of the adjacent pair of the lead groups.

With this embodiment, the second portions of the outermost pair of first leads of each of the lead groups are disposed at a comparatively small spacing. It is therefore possible to ensure a region of a comparatively wide spacing between the second portions of adjacent lead groups. Since the second lead is disposed in this region, it is possible to avoid contact between the first and second leads.

The embodiments of the present invention are described below with reference to the drawings.

First Embodiment

Figure 2:
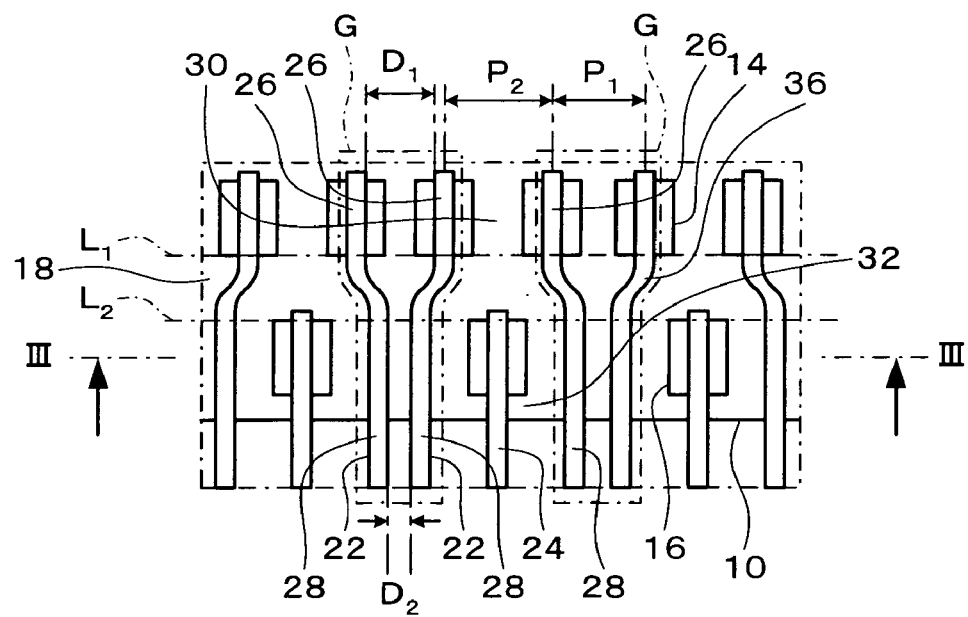
FIG. 2 is an expanded view of the portion of the semiconductor device of FIG. 1 shown surrounded by a broken line.
Figure 3:
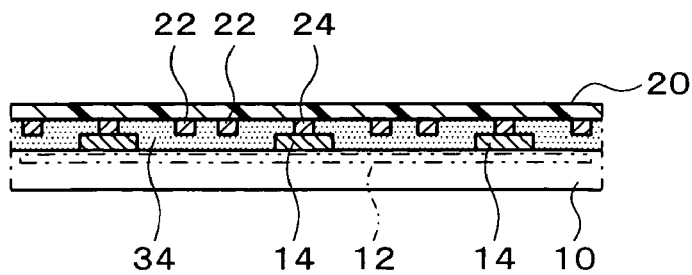
FIG. 3 is a section taken along the line III—III of FIG. 2.

An illustrative view of a semiconductor device in accordance with a first embodiment of the present invention is shown in FIG. 1. An expanded view of the portion of the semiconductor device surrounded by a dotted line in FIG. 1 is shown in FIG. 2, and a section taken along the line III—III of FIG. 2 is shown in FIG. 3.

The semiconductor device has a semiconductor chip 10. The semiconductor chip 10 could be of a shape having rectangular surfaces (a rectangular solid shape). Integrated circuitry 12 is formed on the semiconductor chip 10. A passivation film (electrically insulating film) that is not shown in the figure is formed to cover the integrated circuitry 12.

The semiconductor chip 10 has electrodes 14 aligned along a first straight line $L_1$. The electrodes are aligned in one line. The first straight line $L_1$ could be a straight line that is parallel to an edge of the semiconductor chip 10 (such as a long edge of a rectangular surface thereof). A pair of regions could be delimited by the first straight line $L_1$, with the electrodes 14 being arrayed on the side thereof that is closer to the center of the semiconductor chip 10. The electrodes 14 could also be arrayed at an uneven pitch. For example, the electrodes 14 could be arrayed in such a manner that the pitch between adjacent electrodes is $P_1$ or $P_2$ (where $P_1<P_2$), as shown in FIG. 2. If the electrodes 14 are divided into sections of at least two electrodes each (two in FIG. 2), the pitch within each section of two or more of the electrodes 14 is $P_1$ and the pitch between the electrodes 14 in adjacent sections of two or more of the electrodes 14 is $P_2$.

The semiconductor chip 10 has electrodes 16 aligned along a second straight line $L_2$. The electrodes 16 are arranged in one line. The second straight line $L_2$ could be a straight line that is parallel to one edge of the semiconductor chip 10 (such as a long edge of a rectangular surface thereof). The second straight line $L_2$ could be positioned closer to the edge of the semiconductor chip 10 than the first straight line $L_1$. The electrodes could be arrayed between the second straight line $L_2$ and an edge of the semiconductor chip 10. The electrodes 16 could be arrayed at an uneven pitch.

The first and second straight lines $L_1$ and $L_2$ extend parallel to one another. The electrodes 14 and 16 are disposed on either side of a region 18 between the first and second straight lines $L_1$ and $L_2$. Each of the electrodes 14 and 16 could be a pad and a bump provided thereon, and they could be formed of a metal such as gold or copper. The electrodes 14 and 16 are connected electrically to the interior of the semiconductor chip 10, and at least two of the electrodes 14 and 16 (either all the electrodes or a plurality thereof that is not all of the electrodes) are connected electrically to the integrated circuitry 12. The electrodes 14 and 16 could be formed so as to be exposed from the passivation film (not shown in the figures).

The semiconductor device has a substrate 20. The substrate 20 could be of a film or a plate form. The substrate 20 is formed of a material that has a higher coefficient of thermal expansion (such as a linear coefficient of expansion) than that of the semiconductor chip 10. The substrate 20 could also have a low level of thermal radiation due to having a lower thermal conductivity ratio than the semiconductor chip 10. The substrate 20 could be formed of a resin such as a polyimide resin, or it could be formed of a compound material of an organic material such as a resin and an inorganic material.

The semiconductor chip 10 is mounted on the substrate 20. The packaging form of the semiconductor chip 10 could be chip-on-film (COF). The surface of the semiconductor chip 10 that has the electrodes 14 and 16 faces the substrate 20.

A plurality of leads (including pluralities of first and second leads 22 and 24) is formed on the substrate. The first and second leads 22 and 24 (a portion thereof) face the electrodes 14 and 16 (a portion thereof) and could be bonded thereto. The bond is not limited to just a bond formed by mutual crystallization of the materials; it also includes a bond formed by interposing electrically conductive particles therebetween.

The first leads 22 extend in a direction that crosses (such as orthogonally) the first straight line $L_1$ that acts as a reference linking the electrodes 14. The first leads 22 are drawn out in the direction away from the electrodes 14 towards the second straight line $L_2$, to cross the second straight line $L_2$. The first leads 22 are formed to bend within the region 18 between the first and second straight lines $L_1$ and $L_2$. In this case, the bending could be a shape which curves but which does not have angles. The lack of angles means that there are no local concentrations of stress in the first leads 22, even when they deform, making it difficult for them to break. The first leads 22 could be formed as straight lines (with no bends) by design (before being bonded to the electrodes 14), except for the portions thereof within the region 18 between the first and second straight lines. $L_1$ and $L_2$.

A lead group G is formed of one or more of the first leads 22, and a plurality of the first leads 22 could be divided into a plurality of lead groups G. The outmost pair of the first leads 22 of each lead group G (the two first leads 22 in the example shown in FIG. 2) have first portions 26 that are positioned at a first spacing $D_1$ apart and second portions 28 that are positioned at a second spacing $D_2$ apart. The second spacing $D_2$ is smaller than the first spacing $D_1$.

The second leads 24 extend in a direction that crosses (such as orthogonally) the second straight line $L_2$ that acts as a reference linking the electrodes 16. The second leads 24 are drawn out in the direction away from the electrodes 14 (or the first straight line $L_1$.)

Each of the second leads 24 is positioned between adjacent pairs of lead groups G. The second lead 24 is disposed so as to avoid a region 30 that is sandwiched between the first portions 26 of the adjacent pair of lead groups G. Each of the second leads 24 (either the entirety or only part thereof) is disposed in a region 32 that is sandwiched between the second portions 28 of the adjacent pair of lead groups G.

As shown in FIG. 2, the pair of first portions 26 on one lead group G is disposed at the comparatively wide first spacing $D_1$ ($D_2<D_1$). The region 30 between each adjacent pair of lead groups is therefore narrow in comparison to the region 32. Within one lead group G, on the other hand, the pair of second portions 28 is disposed at the comparatively narrow second spacing $D_2$ ($D_2<D_1$). Thus the region 32 between adjacent pairs of lead groups G is wide in comparison with the region 30. Since the second leads 24 are disposed in the comparatively wide region 32 in this embodiment, it is possible to avoid contact between the first and second leads 22 and 24.

In FIG. 2, the first lead 22 that is in the vicinity of the right-hand side of each second lead 24 is bent and drawn out toward the right-hand direction of the semiconductor chip 10 (see FIG. 1). Generally speaking, each first lead 22 is bent and drawn out toward the closer edge portion of the semiconductor chip 10, in the region 18 between the first and second straight lines $L_1$ and $L_2$, in the vicinity of each second lead 24 (in the vicinity of the closer of the two edge portions of the semiconductor chip 10, in the direction along the first and second straight lines $L_1$ and $L_2$). In each lead group G, the outermost pair of leads of the two or more first leads 22 (the two first leads 22 in the example of FIG. 2) are bent and drawn out in mutually approaching directions between the first and second straight lines $L_1$ and $L_2$.

At least one group of the first and second leads 22 and 24 is formed of a metal such as copper. All of the first leads 22 (or the second leads 24) could be attached to the substrate 20, or at least portions thereof that overlap the semiconductor chip 10 could be attached to the substrate 20. Such attachment includes a direct attachment to the substrate 20, with no adhesive therebetween.

As shown in FIG. 3, a resin (underfill material or adhesive) 34 could be provided between the semiconductor chip 10 and the substrate 20. The resin 34 could press the electrodes 14 and 16 and the first and second leads 22 and 24 together by the force of shrinkage thereof. The resin 34 could also distribute or absorb any stresses generated by differences in thermal expansion between the semiconductor chip 10 and the substrate 20. If the first leads 22 were bent without forming any angles, the precursor of the resin 34 could have good fluidity or filling capability when the resin 34 is provided.

A wiring board in accordance with this embodiment comprises the substrate 20 and leads (first and second leads 22 and 24). Details thereof are as described above.

A method of manufacturing a semiconductor device in accordance with this embodiment comprises a step of mounting the semiconductor chip 10 on the above-described substrate 20. The electrodes 14 and 16 are also connected to the first and second leads 22 and 24. The method of manufacturing the semiconductor device could also comprise could also comprise processes that can be derived from the above description of the semiconductor device.

Figure 4:
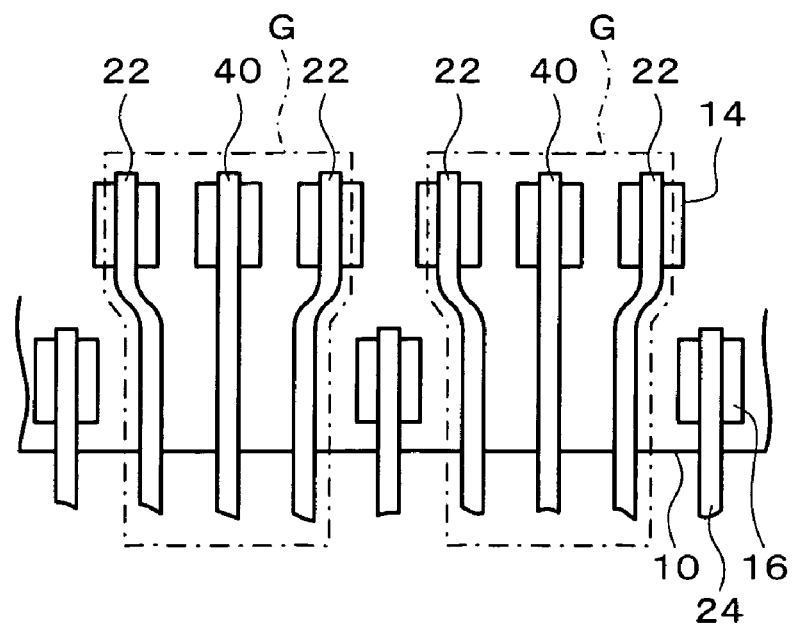
FIG. 4 is illustrative of a modification of the semiconductor device in accordance with the first embodiment.

A modification of the semiconductor device in accordance with this embodiment is shown in FIG. 4. In this modification, each lead group G is configured of more than two first leads 22 and 40 (three in FIG. 4). In this lead group G, all of the two or more first leads 22 and 40, except the pair of leads on the outermost sides (the two first leads 22 in the example of FIG. 4), could be formed to extend in straight lines (such as the first lead 40 that is positioned in the center in this example). In all other details, the semiconductor device, the method of manufacturing the same, and the wiring board in accordance with this modification correspond to those described with reference to the second embodiment.

Figure 5:
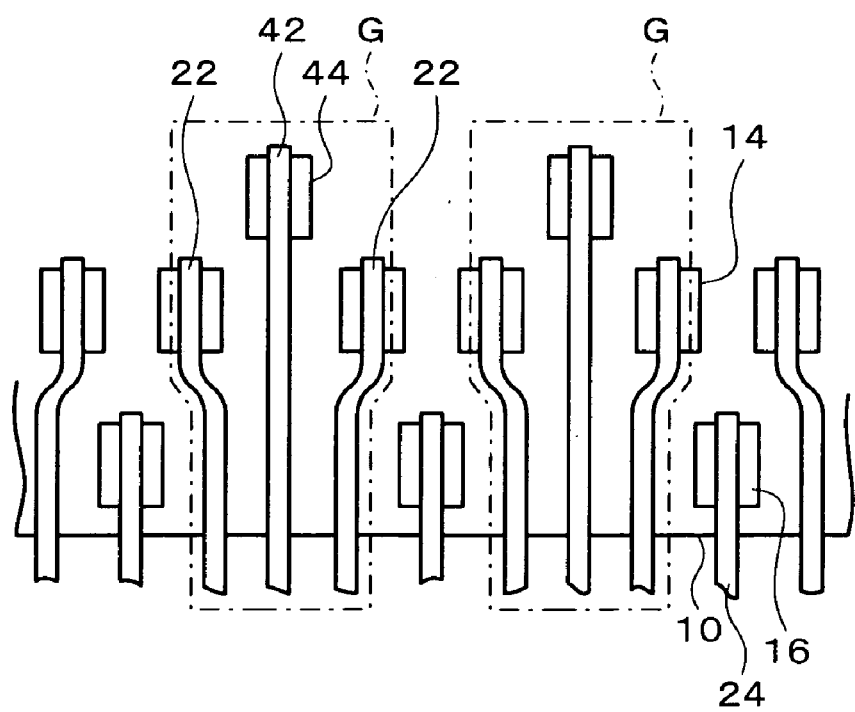
FIG. 5 is illustrative of another modification of the semiconductor device in accordance with the first embodiment.

Another modification of the semiconductor device in accordance with this embodiment is shown in FIG. 5. In this modification, each lead group G is configured of more than two first leads 22 and 42 (three in FIG. 5). In this lead group G, all of the two or more first leads 22 and 42, except the pair of leads on the outermost sides (the two first leads 22 in the example of FIG. 5), could extend in straight lines (such as the first lead 42 that is positioned in the center in this example). The lengths of the first leads 22 and 42 are different. In this lead group G, the pair of leads on the outermost sides of the two or more first leads 22 and 42 (the two first leads 22 in the example of FIG. 5) are of a different length from the other leads (such as the first lead 42 that is positioned at the center in this example). The first lead 42 could be longer than the first leads 22, by way of example. In such a case, a plurality of electrodes 44 could be arranged separately from the arrangement of the plurality of electrodes 14, to correspond to the longer first leads 42. In all other details, the semiconductor device, the method of manufacturing the same, and the wiring board in accordance with this modification correspond to those described with reference to embodiments and modifications described above.

Second Embodiment

Figure 6:
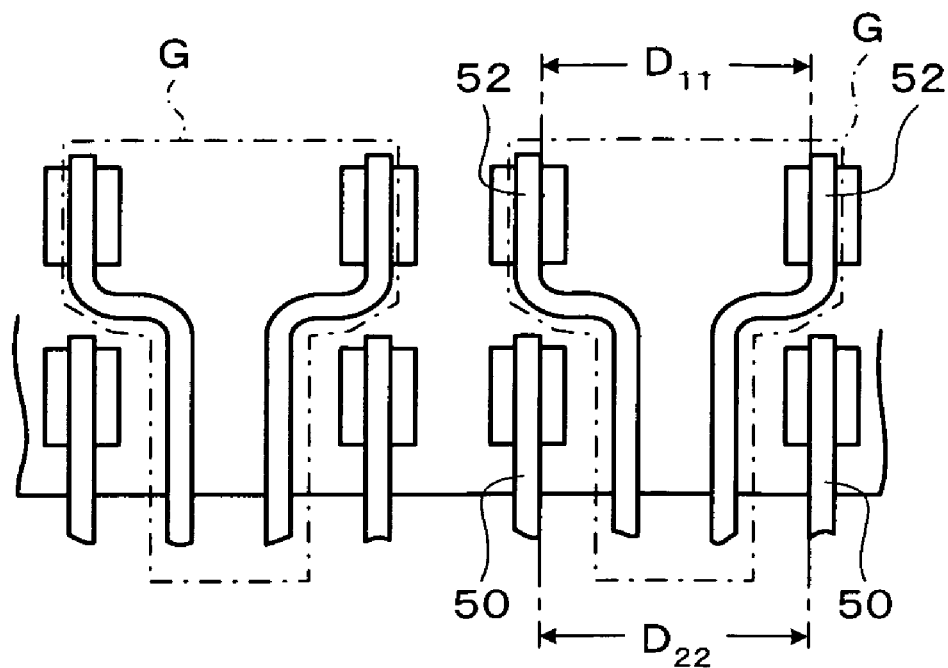
FIG. 6 is illustrative of a semiconductor device in accordance with a second embodiment of the present invention.

An illustrative view of a semiconductor device in accordance with a second embodiment of the present invention is shown in FIG. 6. In this embodiment, the same terminology is used as that for the first embodiment (except for the reference numbers used therefor), to correspond to the same details. In this embodiment, a pair of second leads 50 is disposed so as to sandwich each lead group G. Within each lead group G, a pair of first leads 52 on the outermost sides are formed in such a manner that a first spacing $D_{11}$ is greater than a spacing $D_{22}$ of the pair of second leads 50 that sandwich the lead group G ($D_{22} \leq D_{11}$). In all other details, the semiconductor device, the method of manufacturing the same, and the wiring board in accordance with this embodiment correspond to those described with reference to the first embodiment and the modifications thereof.

Figure 7:
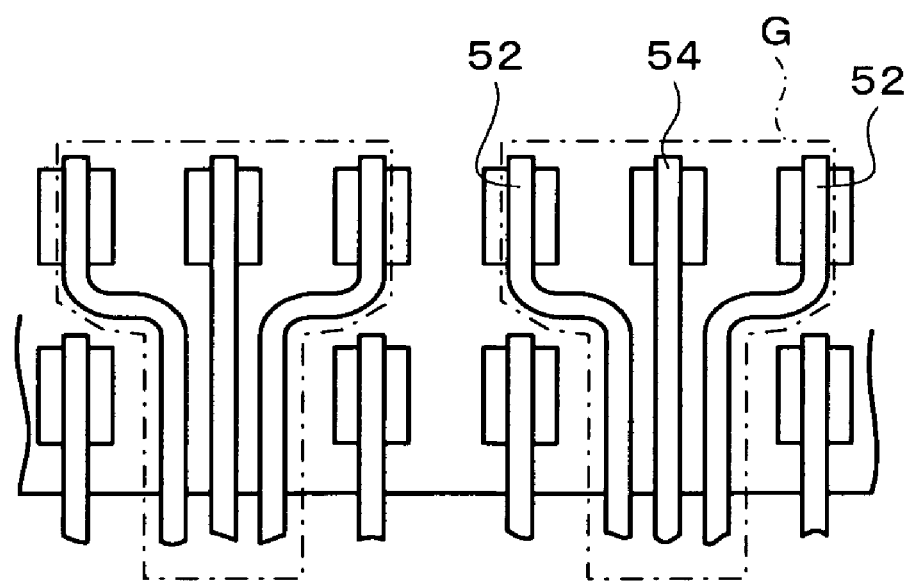
FIG. 7 is illustrative of a modification of the semiconductor device in accordance with the second embodiment.

An illustrative view of a modification of the semiconductor device in accordance with this embodiment is shown in FIG. 7. In this modification, each lead group G is configured of more than two first leads 52 and 54 (three in FIG. 7). In each lead group G, all of the two or more first leads 52 and 54, except the pair of leads on the outermost sides (the two first leads 52 in the example of FIG. 7), could be formed to extend in straight lines (such as the first lead 54 that is positioned in the center in this example). In all other details, the semiconductor device, the method of manufacturing the same, and the wiring board in accordance with this modification correspond to those described with reference to the second embodiment.

Third Embodiment

Figure 8:
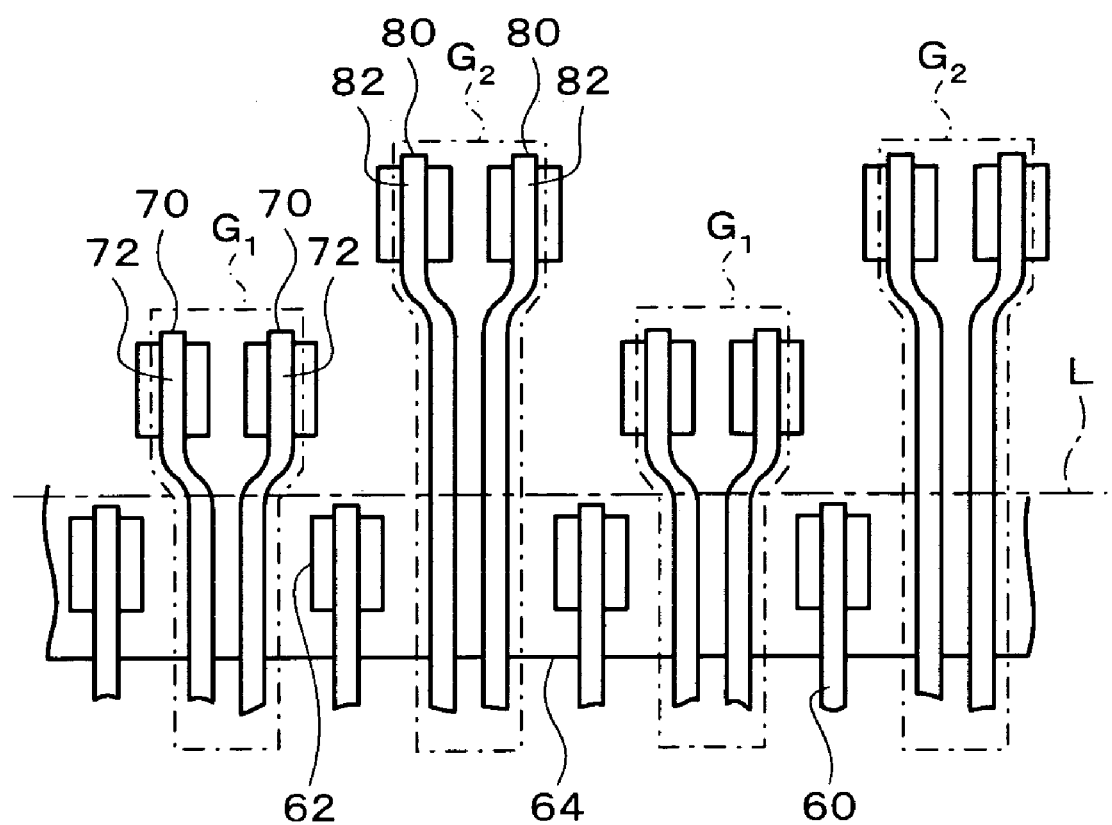
FIG. 8 is illustrative of a semiconductor device in accordance with a third embodiment of the present invention.

An illustrative view of a semiconductor device in accordance with a third embodiment of the present invention is shown in FIG. 8. In this embodiment, the same terminology is used as that for the first embodiment (except for the reference numbers used therefor), to correspond to the same details. In this embodiment, the plurality of lead groups comprises first lead groups $G_1$ and second lead groups $G_2$. The first and second lead groups $G_1$ and $G_2$ are disposed alternately. In other words, a pair of the second lead groups $G_2$ is disposed so as to sandwich one of the first lead groups $G_1$ and a pair of the first lead groups $G_1$ is disposed so as to sandwich one of the second lead groups $G_2$.

In this embodiment, electrodes 62 that face the second leads and are connected electrically thereto could draw a straight line L that is positioned so as to be far from an edge of a semiconductor chip 64. Second leads 60 are each disposed in such a manner that a leading end thereof (the leading end closest to the corresponding electrode 62 to which it is electrically connected) does not go over the straight line L (i.e., it is positioned closer to the edge of the semiconductor chip 10 than the straight line L).

First portions 72 of an outermost pair of first leads 70 of the first lead group $G_1$ (portions thereof that are farthermost from the straight line L) are disposed at positions that are closer to the straight line L than first portions 82 of a pair of first leads 80 of the second lead group $G_2$ (portions thereof that are farthermost from the straight line L).

The first portions 72 of all of the first leads 70 of the first lead group $G_1$ (the portions thereof that are farthermost from the straight line L) could be disposed at positions that are closer to the straight line L than the first portions 82 of all the first leads 80 of the second lead group $G_2$ (portions thereof that are farthermost from the straight line L). In all other details, the semiconductor device, the method of manufacturing the same, and the wiring board in accordance with this modification correspond to those described with reference to the second embodiment.

Other Embodiments

Figure 9:
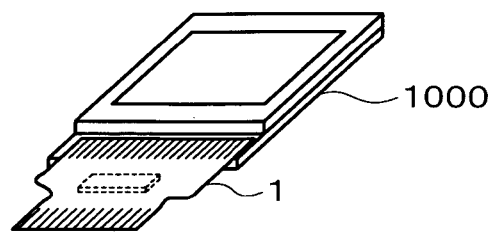
FIG. 9 shows an electronic module to which is attached a semiconductor device in accordance with one embodiment of the present invention.
Figure 10:
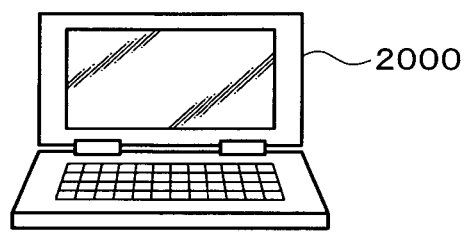
FIG. 10 shows an electronic instrument having a semiconductor device in accordance with one embodiment of the present invention.
Figure 11:
FIG. 11 shows another electronic instrument having a semiconductor device in accordance with one embodiment of the present invention.

An electronic module (such as a liquid crystal module) 1000 on which is mounted a semiconductor device 1 in accordance with the above-described embodiment of the present invention is shown in FIG. 9. A notebook personal computer 2000 shown in FIG. 10 and a portable phone 3000 shown in FIG. 11 are examples of electronic instruments having this semiconductor device.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device comprising:
a substrate on which is formed a plurality of leads; and
a semiconductor chip having a plurality of electrodes, the leads and the electrodes being mounted on the substrate in a manner to face each other and to be electrically connected,
wherein the plurality of leads includes a plurality of lead groups, each of which are formed of at least two first leads, and a plurality of second leads,
wherein each of the second leads is positioned between an adjacent pair of the lead groups,
wherein each of an outermost pair of the first leads of each of the lead groups includes a first portion at its end and a second portion extending from the first portion, the first portion of each of the outermost pair of the first leads being positioned at a first spacing apart and the second portion of each of the outermost pair of the first leads being positioned at a second spacing apart which is smaller than the first spacing, and
wherein each of the second leads is not disposed in a region that is sandwiched between the first portion of the outermost pair of the first leads of the lead groups, and has a portion that is disposed in a region that is sandwiched between the second portion of the outermost pair of the first lead of the lead groups.

2. The semiconductor device as defined by claim 1,
wherein an adjacent pair of the second leads is disposed so as to sandwich one of the lead groups, and
wherein the outermost pair of the first leads of each of the lead groups is formed so that the first spacing is greater than or equal to a spacing of the adjacent pair of the second leads.

3. The semiconductor device as defined by claim 1,
wherein the plurality of lead groups includes a first lead group and a second lead group,
wherein the second leads are formed in such a manner that an end of each of the second leads does not pass over a straight line, and
wherein the first portion of each of the outermost pair of the first leads of the first lead group is disposed at a position closer to the straight line than the first portion of each of the outermost pair of the first leads of the second group.

4. The semiconductor device as defined by claim 1,
wherein each of the lead group includes at least three of the first leads, and
wherein the outermost pair of the first leads of each lead group are of a different length from a length of a remaining one of the first leads which is sandwiched between the outermost pair of the first leads.

5. An electronic module to which is attached the semiconductor device defined by claim 1.

6. An electronic instrument having the semiconductor device defined by claim 1.

7. A wiring board comprising:
a substrate; and
a plurality of leads which are formed on the substrate,
wherein the plurality of leads includes a plurality of lead groups, each of which are formed of at least two first leads, and a plurality of second leads,
wherein each of the second leads is positioned between an adjacent pair of the lead groups,
wherein each of an outermost pair of the first leads of each of the lead groups includes a first portion at its end and a second portion extending from the first portion, the first portion of each of the outermost pair of the first leads being positioned at a first spacing apart and the second portion of each of the outermost pair of the first leads being positioned at a second spacing apart which is smaller than the first spacing, and
wherein each of the second leads is not disposed in a region that is sandwiched between the first portion of the outermost pair of the first leads of the lead groups, and has a portion that is disposed in a region that is sandwiched between the second portion of the outermost pair of the first leads of the lead groups.

8. The wiring board as defined by claim 7,
wherein an adjacent pair of the second leads is disposed so as to sandwich one of the lead groups, and
wherein the outermost pair of the first leads of each of the lead groups is formed so that the first spacing is greater than or equal to a spacing of the adjacent pair of the second leads.

9. The wiring board as defined by claim 7,
wherein the plurality of lead groups includes a first lead group and a second lead group,
wherein the second leads are formed in such a manner that an end of each of the second leads does not pass over a straight line, and
wherein the first portion of each of the outermost pair of the first leads of the first lead group is disposed at a position closer to the straight line than the first portion of each of the outermost pair of the first leads of the second group.

10. The wiring board as defined by claim 7,
wherein each of the lead group includes at least three of the first leads, and
wherein the outermost pair of the first leads of each lead group are of a different length than a length of a remaining one of the first leads which is sandwiched between the outermost pair of the first leads.

11. A method of a manufacturing a semiconductor device, the method comprising:
mounting a semiconductor chip having a plurality of electrodes onto a substrate on which is formed a plurality of leads, in such a manner that the electrodes face the leads; and
bonding the electrodes and the leads,
wherein the plurality of leads includes a plurality of lead groups, each of which are formed of at least two first leads, and a plurality of second leads,
wherein each of the second leads is positioned between an adjacent pair of the lead groups,
wherein each of an outermost pair of the first leads of each of the lead groups includes a first portion at its end and a second portion extending from the first portion, the first portion of each of the outermost pair of the first leads being positioned at a first spacing apart and the second portion of each of the outermost pair of the first leads being positioned at a second spacing apart which is smaller than the first spacing, and
wherein each of the second leads is not disposed in a region that is sandwiched between the first portion of the outermost pair of the first leads of the lead groups, and has a portion that is disposed in a region that is sandwiched between the second portion of the outermost pair of the first leads of the lead groups.

\* \* \* \* \*